(12) United States Patent
Huang et al.

(10) Patent No.: US 10,957,555 B2
(45) Date of Patent: Mar. 23, 2021

(54) PROCESSING METHOD FOR PRODUCING PHOTOMASK WITH DOUBLE PATTERNS AND STORAGE MEDIUM THEREOF

(71) Applicant: Winbond Electronics Corp., Taichung (TW)

(72) Inventors: Chien-Chin Huang, Taichung (TW); Shih-Min Tseng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/543,637

(22) Filed: Aug. 19, 2019

(65) Prior Publication Data

US 2020/0152474 A1 May 14, 2020

(30) Foreign Application Priority Data

Nov. 13, 2018 (TW) ................. 107140286

(51) Int. Cl.
*G06F 30/33* (2020.01)
*H01L 21/311* (2006.01)
(Continued)

(52) U.S. Cl.
CPC .... *H01L 21/31144* (2013.01); *H01L 21/0337* (2013.01); *H01L 21/76816* (2013.01)

(58) Field of Classification Search
CPC .......... G03F 1/70; G03F 1/36; G03F 7/70283; G03F 1/26; G03F 1/30; G03F 7/70625; G03F 7/70091; G03F 7/705; G03F 1/34; H01L 29/7869; G06F 30/367; G06F 30/398; G06F 30/20; G06F 2115/06; G06F 2119/18; G06F 30/392; G06F 2111/04;
(Continued)

(56) References Cited

U.S. PATENT DOCUMENTS

2011/0217630 A1* 9/2011 Liu .................. G06F 30/39
430/5
2011/0271238 A1* 11/2011 Mansfield ............ G03F 1/36
716/55
(Continued)

FOREIGN PATENT DOCUMENTS

CN 101276141 10/2008
TW 201810096 3/2018

*Primary Examiner* — Binh C Tat
(74) *Attorney, Agent, or Firm* — JCIPRNET (57) ABSTRACT

A process method for producing a photomask with double patterns. The processing method includes obtaining a contact distribution pattern, having multiple contacts. The contacts are sorted into multiple contact blocks in array type, pair type and isolation type. The contacts are decomposed into a first patterning group and a second patterning group, which are configured to interpose to each other. The numbers of contacts of the first patterning group and the second patterning group are equal within an error range. The first patterning group and the second patterning group are check whether or not having adjacent two contacts with a distance less than a minimum distance. If it is less than a minimum distance, one of the adjacent two contacts is changed from a current one of the first patterning group and the second patterning group to another. The first/second patterning groups are output to from first/second photomasks.

10 Claims, 10 Drawing Sheets

(51) Int. Cl.
*H01L 21/768* (2006.01)
*H01L 21/033* (2006.01)

(58) Field of Classification Search
CPC .. G06F 2111/08; G06F 2119/12; G06F 30/33; G06F 30/39; G02F 2202/10; G02F 1/13613
USPC .................................................... 716/50–56
See application file for complete search history.

(56) References Cited

U.S. PATENT DOCUMENTS

2015/0161320 A1\* 6/2015 Li .............................. G03F 1/36
716/54
2018/0315645 A1 11/2018 Schultz \* cited by examiner

PROCESSING METHOD FOR PRODUCING PHOTOMASK WITH DOUBLE PATTERNS AND STORAGE MEDIUM THEREOF

CROSS-REFERENCE TO RELATED APPLICATION

This application claims the priority benefit of Taiwan application serial no. 107140286, filed on Nov. 13, 2018. The entirety of the above-mentioned patent application is hereby incorporated by reference herein and made a part of this specification.

BACKGROUND

Technical Field

The invention is related to semiconductor fabrication technology, and particularly to a processing method for producing photomask with double patterns.

Description of Related Art

Since the photoresist pattern as to be formed involves irradiating light source through a photomask so to transform a photomask pattern onto the photoresist layer. Inevitably, the pattern of the photoresist layer would be expanded and deformed due to the optical diffraction effect on the photomask, relating to the wavelength of the light source, such as the yellow light.

To avoid the contact windows on the photomask are too closing to each other, resulting in the optical diffraction effect and causing improper connection of the device structure, a single photomask can be divided into two photomasks. As a result, the density of the contact windows of the photomask can be reduced, and then the optical diffraction effect can be reduced as well. However, how to properly decompose the contact window patterns in single-one photomask into two photomasks is still needed to further develop.

SUMMARY

The invention provides a technology about processing method for producing photomask with double patterns, capable of systematically decomposing a plurality of contact windows in one photomask into two photomasks, in which the numbers of the contact windows for the two photomasks are about same, and the density of contact windows can still have uniform distribution.

In an embodiment, the invention provides a processing method for producing photomask with double patterns, used by a processing apparatus. The processing method comprises obtaining a contact distribution pattern, the contact distribution pattern comprising a plurality of contact windows. The contact windows are sorted into a plurality of contact window groups according to sizes of the contact windows. The contact windows of each of the contact window groups are identified into contact blocks of an array type, a pair type, or an isolation type. A phase decomposition of the contact windows is performed, wherein the contact windows respectively belonging to the array type, the pair type and the isolation type are decomposed into a first pattern group and a second pattern group according to an optimized parameter. A loop processing step is performed. The loop processing step comprises checking whether or not a confliction port occurs between the first pattern group and the second pattern group, according to a phase rule check; if the confliction portion occurring, modifying the first pattern group and the second pattern group with a fine adjustment by switching to each other; performing a statistic analysis on the first pattern group and the second pattern group, checking whether or not the first pattern group and the second pattern group are consisting to each other within an error range as allowed, wherein when the first pattern group and the second pattern group are consistent and then are output; and performing a phase switching modification of the contact windows and returning back to and continuing the loop processing step when the first pattern group and the second pattern group are inconsistent. If a number of the looping is over a threshold, then the looping processing step stops and a failure notification is issued.

In an embodiment, as to the processing method, the step of obtaining contact distribution pattern comprises obtaining a device contact window pattern. The device contact window pattern comprises multiple device contact windows as expected to be formed. In addition, the sizes of the contact windows are corrected according to a size correction data in photographic process, so to obtain the contact windows, forming the contact distribution pattern.

In an embodiment, as to the processing method, by using a layout design rule, according to sizes of the contact windows, the contact windows are sorted into N sizes of the contact windows, N is an integer. The N sizes of the contact windows is further divided into 2N sizes of the contact windows, according to a first extending direction and a second extending direction. The first extending direction is perpendicular to the second extending direction.

In an embodiment, as to the processing method, it further comprises calculating a number of the contact windows for each of the 2N sizes of the contact windows.

In an embodiment, as to the processing method, the step of performing the statistic analysis on the first pattern group and the second pattern group comprises: calculating a quantity of the contact windows respectively for the first pattern group and the second pattern group after the phase decomposition of the contact windows; performing a statistic calculation for each of the sizes of the contact windows, according a standard deviation in the statistic analysis, so to obtain a quantity ratio between the first pattern group and the second pattern group; and determining a whole decomposing rate after the first pattern group and the second pattern group are decomposed, wherein the decomposing rate is 50% to 50% within an allowable range, and the standard deviation is the less than a present value, the first pattern group and the second pattern group are output.

In an embodiment, as to the processing method, it further comprises providing the first pattern group and the second pattern group to serv as a first photomask pattern and a second photomask pattern.

In an embodiment, as to the processing method, the step of performing the decomposing the contact windows is firstly decomposing the contact windows of the array type and the pair type and then decomposing the contact windows of the isolation type.

In an embodiment, as to the processing method, the array type has at least three contact windows as same and adjacent within a set distance, regularly distributing in one-dimension or two-dimension. T pair type has two contact windows as same and adjacent within a set distance, distributed with boundaries of the two contact windows being parallel and having an overlap. The isolation type is the contact windows other thane the array type and the pair type.

In an embodiment, as to the processing method, the phase rule check in the first pattern group or the second pattern group comprises boundary-to-boundary check to a distance between long boundary of adjacent two contact windows, and a vertex-to-vertex check to a distance between vertices of the adjacent two contact windows.

In an embodiment, as to the processing method, identifying to the array type and the pair type comprises boundary-to-boundary check. The boundary-to-boundary check is to check a distance between long boundaries of the adjacent two contact window is less than a set distance.

In an embodiment, as to the processing method, the boundary-to-boundary check comprises an overlapping portion between adjacent two parallel boundaries is not less than a set value.

In an embodiment, as to the processing method, each of the contact window blocks of the pair type is decomposed by interposing.

In an embodiment, as to the processing method, each of the contact window blocks of the array type is decomposed by zigzag staggering.

In an embodiment, as to the processing method, each of the contact window blocks of the isolation type is an individual contact window alternately assigned to the first pattern group and the second pattern group.

In an embodiment, the invention further provides a processing method for producing photomask with double patterns. The processing method comprises obtaining a contact distribution pattern, the contact distribution pattern comprising a plurality of contact windows, sizes of the contact windows comprise corrections with a lithographic factor; sorting the contact windows into a plurality of contact window groups according to sizes and extending directions of the contact windows. The contact windows of each of the contact window groups are identified into contact blocks of an array type, a pair type, or an isolation type. The contact windows is decomposed into a first pattern group and a second pattern group, wherein the first pattern group and a second pattern group are configured to interpose to each other, wherein a first quantity of the contact windows in the first pattern group is consisting with a second quantity of the contact windows in the second pattern group within an error range. The processing method further comprises checking the first pattern group and the second pattern group whether or not a gap between adjacent two of the contact windows is less than a minimum distance; changing an assignment of the first pattern group and the second pattern group for one of the adjacent two of the contact windows having the gap less than the minimum distance when a condition to decompose the contact windows still remains being satisfied; and outputting the first pattern group and the second pattern group to correspondingly produce a first photomask and a second photomask.

In an embodiment, as to the processing method, each of the contact window blocks of the pair type is decomposed by interposing.

In an embodiment, as to the processing method, wherein each of the contact window blocks of the array type is decomposed by zigzag staggering.

In an embodiment, the invention has also provided a recording medium, executed by a processing system, the recording medium comprises a processing program to execute the processing method described above.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
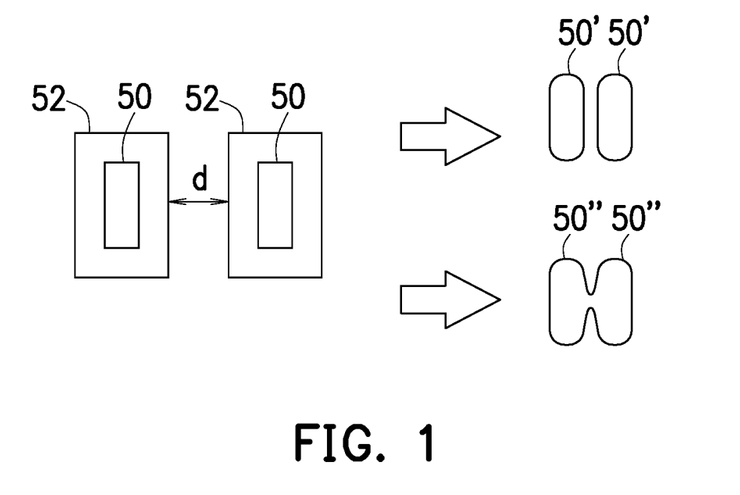
FIG. 1 is a drawing, schematically illustrating an optical diffraction effect in the lithographic process as considered, according to an embodiment of the invention.

FIG. 1 is a drawing, schematically illustrating an optical diffraction effect in the lithographic process as considered, according to an embodiment of the invention. Referring to FIG. 1, the contact window used in the lithographic process, when taking the optical diffraction effect into account, the contact window 52 of the photomask is larger than the contact window 50 as actually designed and to be formed, so to compensate the optical diffraction effect. The distance between the contact window 52 of the photomask is d. The contact window 52 of the photomask in the lithographic process would form a contact window 50' on the photoresist layer at the end. However, when the distance d in accordance with the device size is reduced, due to small distance d, it would easily cause a connection by contact between the contact windows 50" as actually formed. When using contact window 50" of the photoresist layer for etching process, it would cause the improper connection between the device and then cause the failure of the product.

Figure 2:
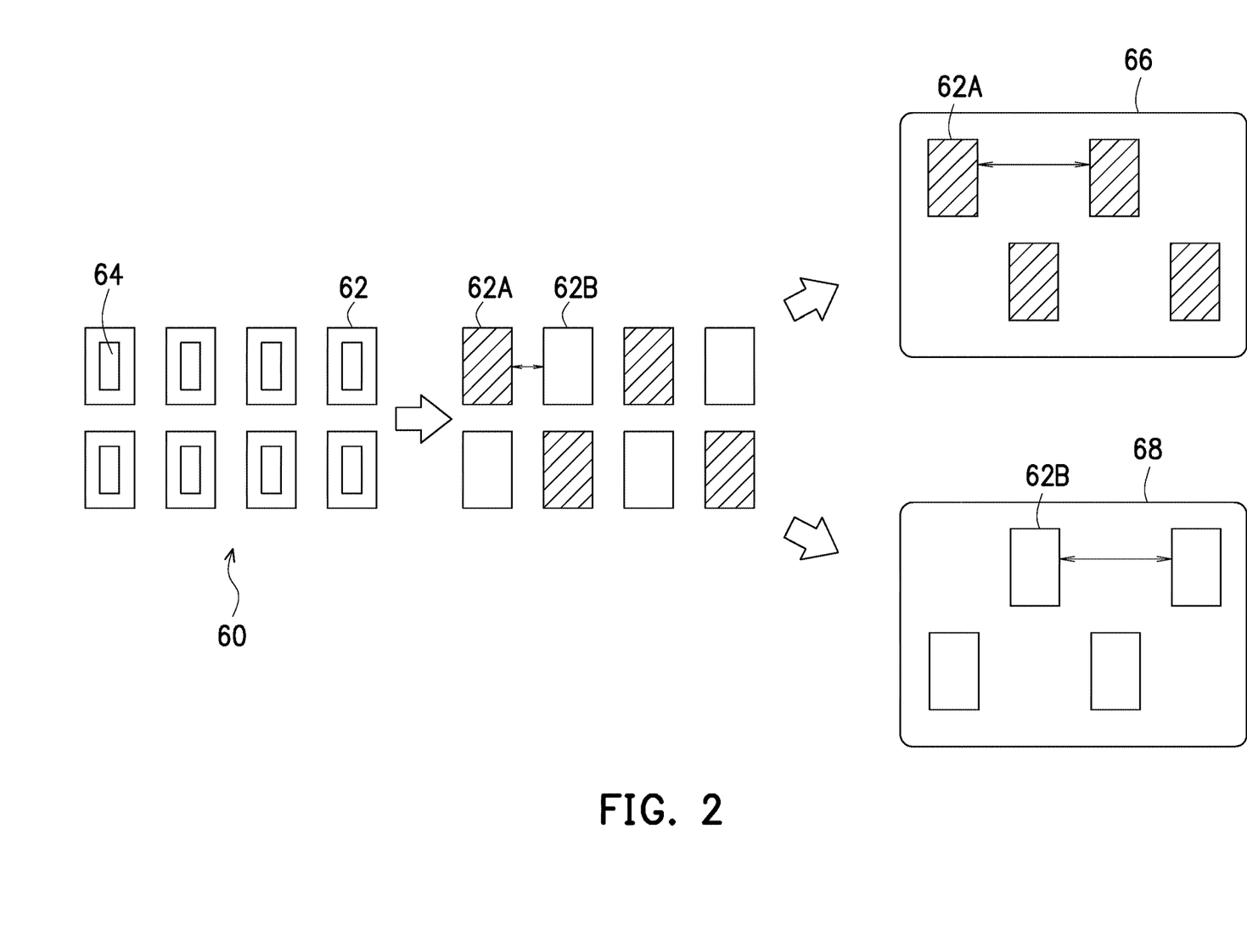
FIG. 2 is a drawing, schematically illustrating a structure of photomask with double patterns, according to an embodiment of the invention.

To avoid the issue about too small distance d between the contact windows, it can decompose the contact windows 50 in the photomask, in which the contact windows are accordingly formed corresponding to need in design, into two photomasks. FIG. 2 is a drawing, schematically illustrating a structure of photomask with double patterns, according to an embodiment of the invention. Referring to FIG. 2, to the photomask pattern 60 in single layer, it corresponds to the locations of the contact windows 64 and add the bias correction due to lithographic correction. Multiple contact windows 62 distributed in a single layer as needed can be obtained. The distances between the contact windows 62 may be rather close, and easily cause the defects as at least stated in FIG. 1.

The strategy of the invention is to uniformly decompose the contact windows 62 into two photomasks. In other words, the contact windows 62 as distributed in single layer is decomposed into contact windows 62A and contact windows 62B. The photomask 66 and the photomask 68 are respectively formed according to the contact windows 62A and the contact windows 62B. The photomask 66 is just based on the contact windows 62A, so the distance between the contact windows 62A is increased and the probability for occurring a connection between adjacent contact windows cam be reduced. Likewise, the photomask 68 is formed just based on the contact windows 62B, so the distance between the contact windows 62B is increased. If the photomask 66 and the photomask 68 are stacked, the contact windows 62A and the contact windows 62B can recover the distribution of the contact windows as intended.

The photomask 66 and the photomask 68 after decomposition are used to form the photoresist layer, which is then used as an etching mask. After the etching process, the contact windows 62 can be formed in the dielectric layer, as provided for filling conductive material in the subsequent process. A relatively straightforward way is using the photomask 66 and the photomask 68 to respectively define the photoresist layer t form the photoresist pattern and then an etching process is performed using the photoresist pattern as an etching mask. This manner can be referred as a litho-litho-etch (LLE) process.

Figure 3:
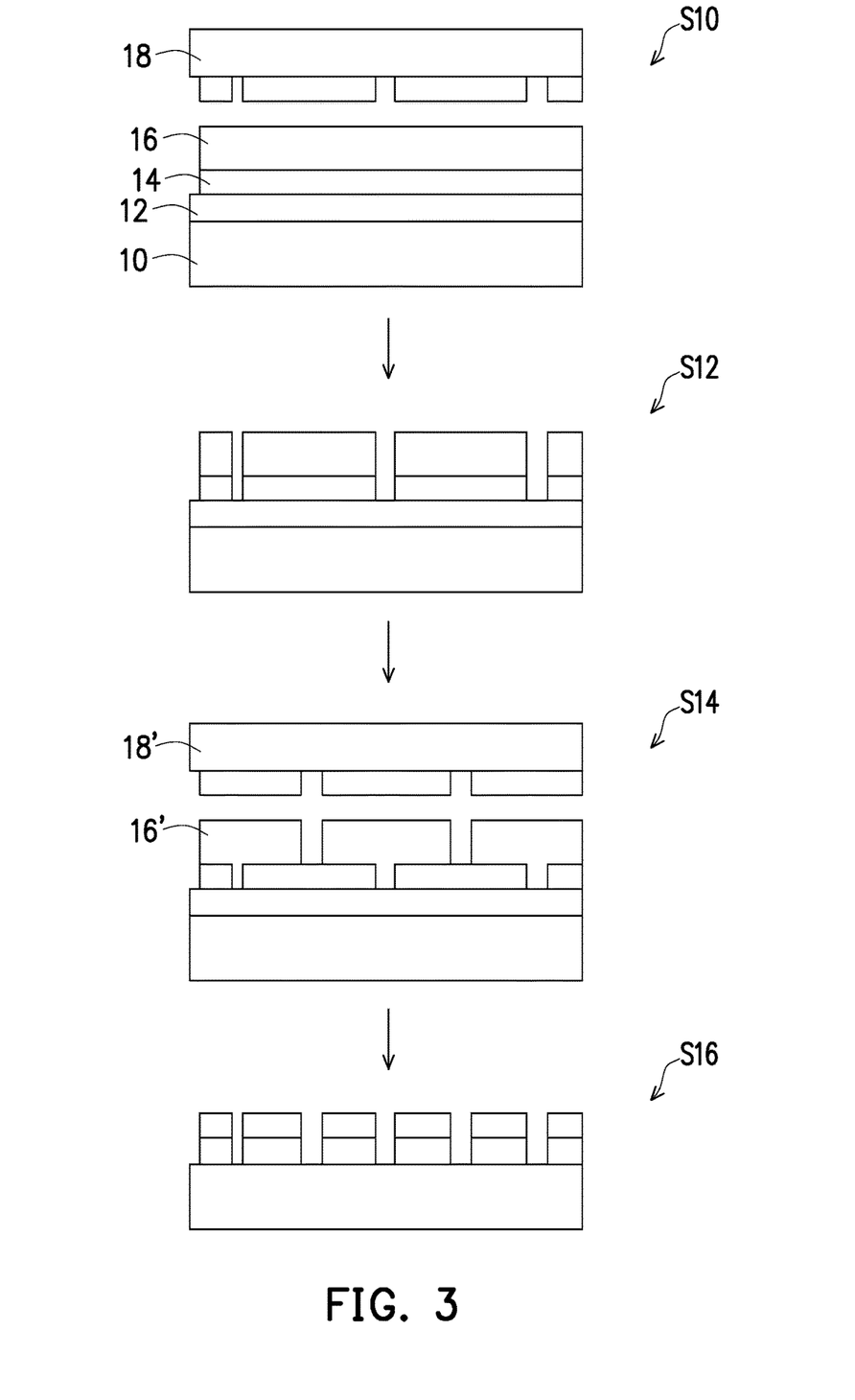
FIG. 3 is a drawing, schematically illustrating a fabrication process based on the photomask with double patterns, according to an embodiment of the invention.

Another fabrication flow is a litho-etch-litho-etch (LELE) process. FIG. 3 is a drawing, schematically illustrating a fabrication process based on the photomask with double patterns, according to an embodiment of the invention.

Referring to FIG. 3, the steps S10, S12, S14, S16 in a sequence from left side to the right side is a litho-etch-litho-etch process. In step S10, the substrate 10 has a dielectric layer 12 and a dielectric layer 14 thereon. The photoresist layer 16 is formed on the dielectric layer 14. The photomask 18 has a group of contact windows, which is used in the lithographic process to develop image on the photoresist layer 16. In step S12, the photomask layer 18 is used to form the contact windows in the photoresist layer and the then dielectric layer 14 is etched to form the corresponding contact windows. In step S14, another photoresist layer 16' is formed with another group of contact windows by use of another photomask 18'. In step S16, the photoresist layer 16' is used as a etching mask and another etching process is performed. Finally, the contact windows as needed are formed in the dielectric layer 12 and the dielectric layer 14.

Figure 4:
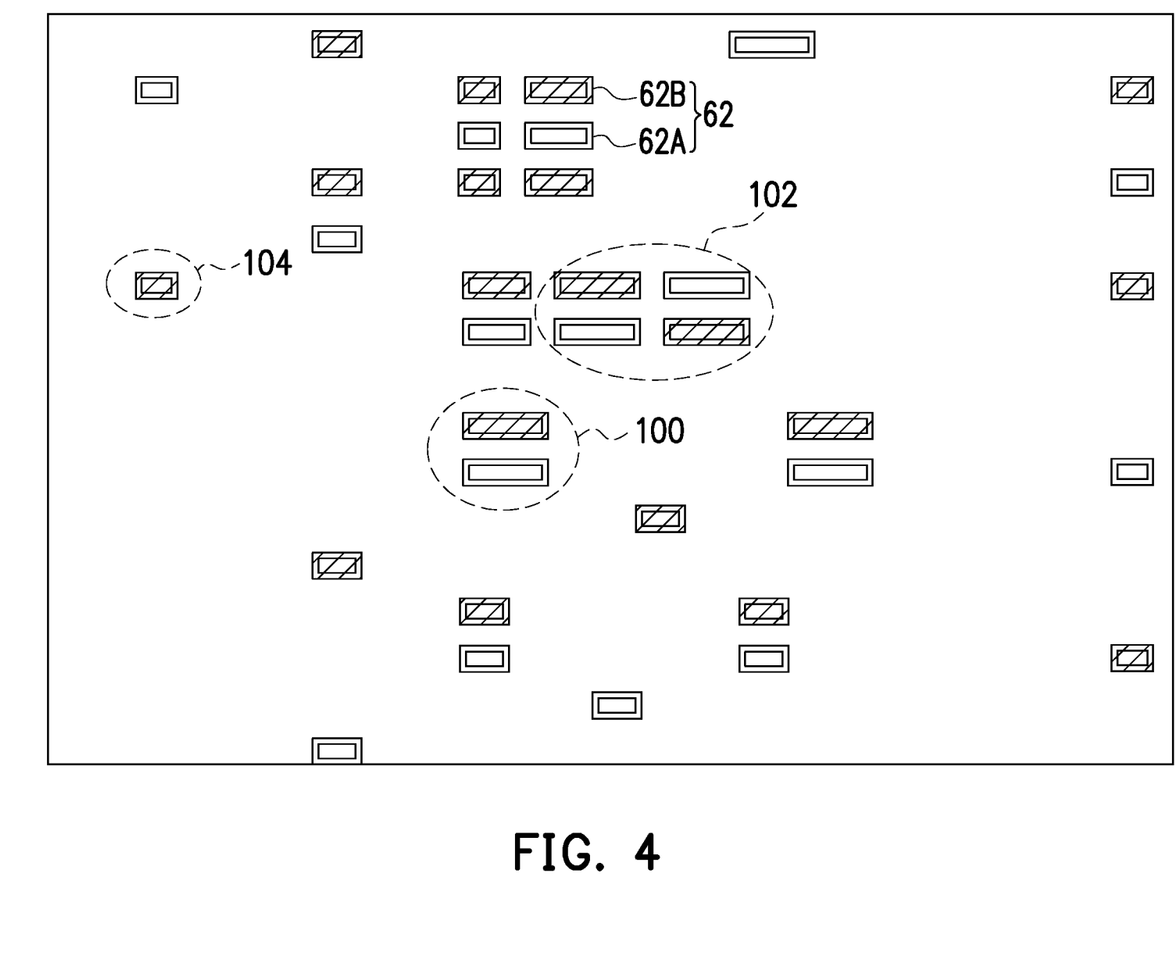
FIG. 4 is a drawing, schematically illustrating the contact windows in array type, pair type and isolation type, according to an embodiment of the invention.

FIG. 4 is a drawing, schematically illustrating the contact windows in array type, pair type and isolation type, according to an embodiment of the invention. Referring to FIG. 4, the invention sorts the contact windows as originally designed into array type contact windows 102, pair type contact windows 100 and isolation type contact windows 104, according to the implemented locations. The array type contact windows 102 include three or more contact windows in same size to form a group in one-dimension or two-dimension. The pair type contact windows 100 include two parallel contact windows in same size. Each of the isolation type contact windows 104 is a contact window singularly existing. In an embodiment, the isolation type contact windows 104 are the contact windows other than the array type contact windows 102, pair type contact windows 100.

Figure 5:
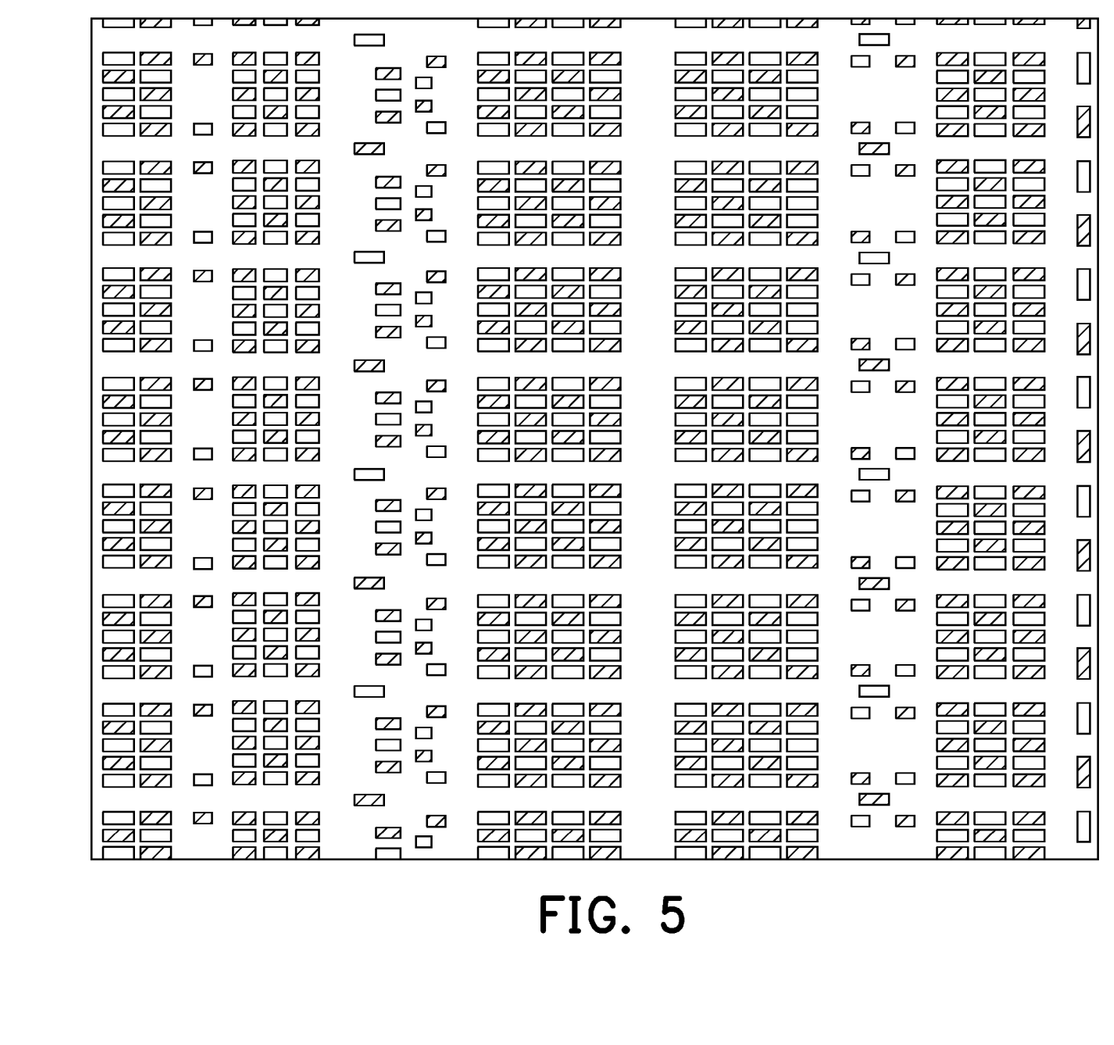
FIG. 5 is a drawing, schematically illustrating a mechanism to decompose a photomask pattern in single layer to two patterns, according to an embodiment of the invention.

FIG. 5 is a drawing, schematically illustrating a mechanism to decompose a photomask pattern in single layer to two patterns, according to an embodiment of the invention. Referring to FIG. 5, in the actual fabrication for the semiconductor structure, the number of the contact windows to be formed is a large number, therefor it is very dense between the contact windows. One contact window is corresponding to one contact window in the photomask, according to an embodiment, the contact windows distributed in the single layer are decomposed into two contact window patterns, in which one contact window pattern is formed from the contact windows as indicated by slash and another contact window pattern is formed from the contact windows without slash. As a result, two sub-photomasks ca be produced. However, to properly and systematically decompose into two contact window patterns, it needs to sort the contact windows so that contact windows corresponding to the types are respectively decomposed.

Figure 6A:
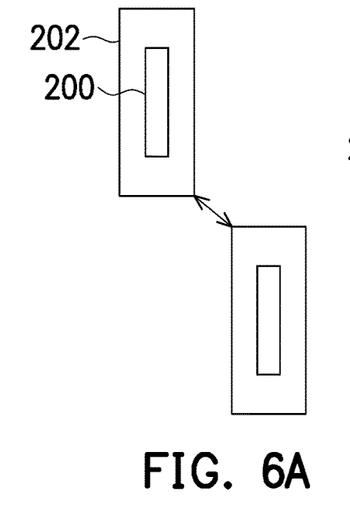
FIGS. 6A-6C are drawings, schematically illustrating the types for the adjacent contact windows, according to an embodiment of the invention.
Figure 6B:
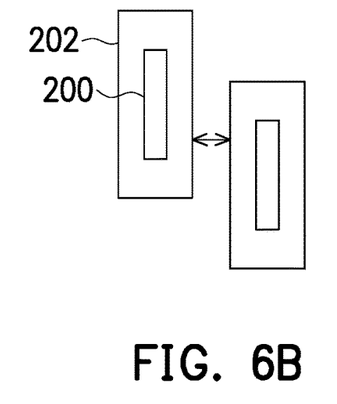
Figure 6C:
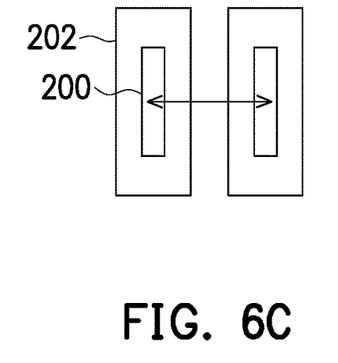

As the analysis to the contact window distribution, in an embodiment, it needs to consider some geometric parameters. FIGS. 6A-6C are drawings, schematically illustrating the types for the adjacent contact windows, according to an embodiment of the invention. Referring to FIG. 6A, it is the geometric parameter of vertex-to-vertex (V2V). To the adjacent two contact windows 200, in an example, they are belonging to the contact window distribution originally in a single layer. The contact windows 202 for the photomask is obtained after applying optical correction on the contact window 200. There is no overlap portion in parallel for the contact windows 202, it then has the relation of vertex-to-vertex relation. The distance between the vertex to vertex is the V2V geometric parameter.

Referring to FIG. 6B, when boundaries of the adjacent two contact windows 200 have a parallel overlap portion, that is, the adjacent two contact windows 200 are parallel but the they are shifted along the parallel direction. In this situation, the geometry parameter of boundary-to-boundary (B2B) need to be considered. Referring to FIG. 6C, the adjacent two contact windows 200 are exactly parallel. In addition to the B2B geometry parameter, it still has the geometry parameter of center-to-center (C2C).

Figure 7:
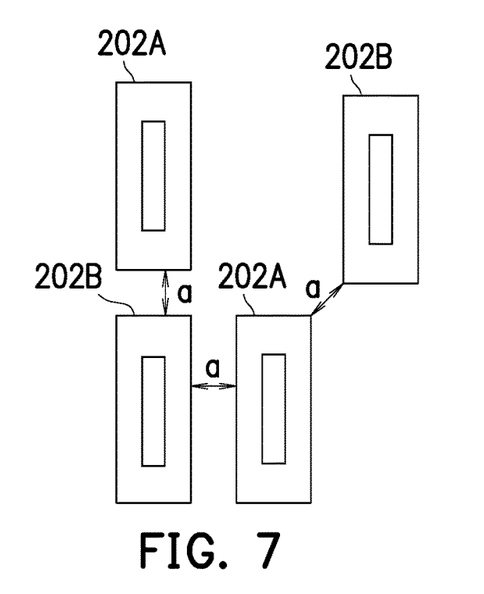
FIG. 7 is a drawing, schematically illustrating the minimum distance in the contact window pattern, according to an embodiment of the invention.

FIG. 7 is a drawing, schematically illustrating the minimum distance in the contact window pattern, according to an embodiment of the invention. Referring to FIG. 7, to multiple contact windows, the contact windows can be decomposed into contact windows 202A and contact windows 202B. However, when the contact windows 202A and the contact windows 202B are combined into a contact window distribution in a single layer, it needs to consider the gap a between the contact windows, which is a combined consideration of the V2V effect and the B2B effect.

Here as to the contact windows, the action to decompose the original contact windows into two types of contact windows can be referred as a phase decomposition. The contact window in different phase represents the different contact window pattern after the contact windows are decomposed.

Figure 8A:
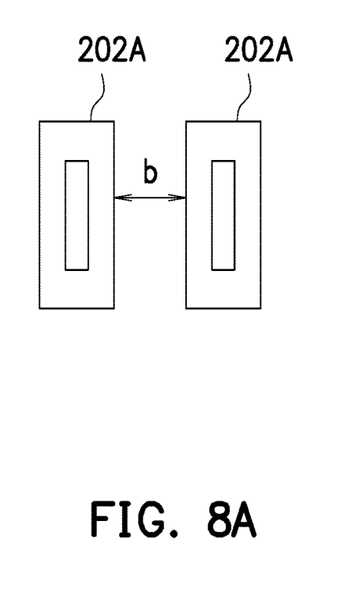
FIGS. 8A and 8B are drawings, schematically illustrating mechanism of boundary-to-boundary check, according to an embodiment of the invention.
Figure 8B:
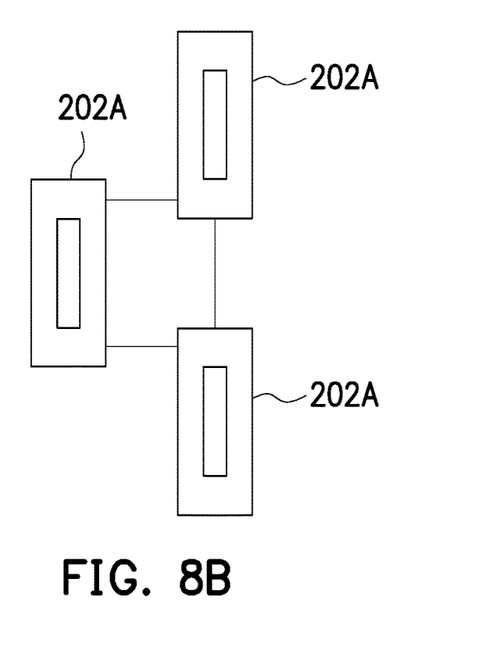

FIGS. 8A and 8B are drawings, schematically illustrating mechanism of boundary-to-boundary check, according to an embodiment of the invention. Referring to FIG. 8A, as to the contact windows in the same phase after decomposition, it needs to check under the phase rule check (PRC) mechanism to see whether or not any confliction occurs. In an embodiment, the boundary check for the adjacent two contact windows 202A in an example needs to assure the gap b between boundaries of the contact windows is larger than a minimum value. Although the contact windows are decomposed, for the contact windows with the same phase, the adjacent two contact windows may be from the remaining in different groups after decomposition and it may still have a small number of contact windows being densely adjacent, which need the phase rule check to further exclude. Referring to FIG. 8B, when multiple contact windows are disposed in parallel, similar to the consideration in FIG. 8A, it also needs to check whether or not the occurrence for the contact windows being densely adjacent.

Figure 9A:
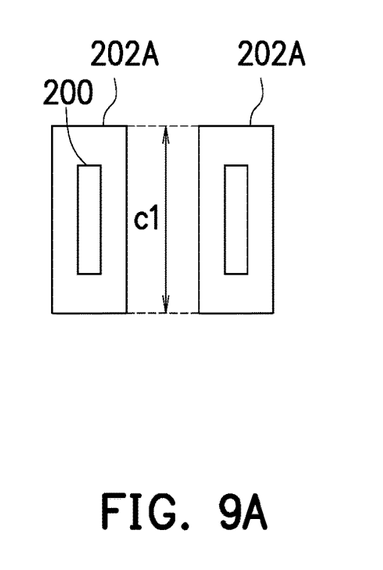
FIGS. 9A and 9C are drawings, schematically illustrating the relation of the contact windows of pair type, according to an embodiment of the invention.
Figure 9B:
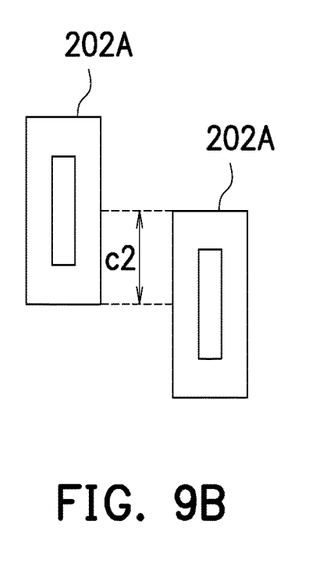
Figure 9C:
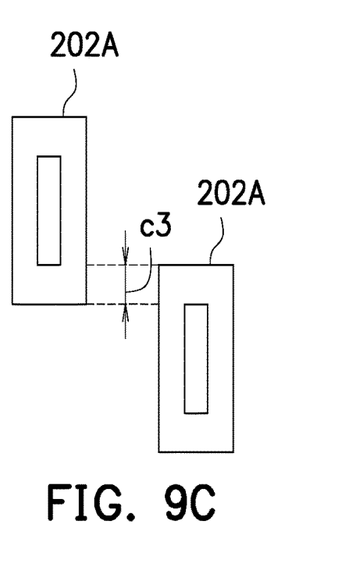

FIGS. 9A and 9C are drawings, schematically illustrating the relation of the contact windows of pair type, according to an embodiment of the invention. Referring to FIG. 9A, in the contact window pattern of the same phase, the adjacent two contact windows 202A are considered as a parallel type, in which the length of the overlap portion is not smaller than the set length C3.

Figure 10A:
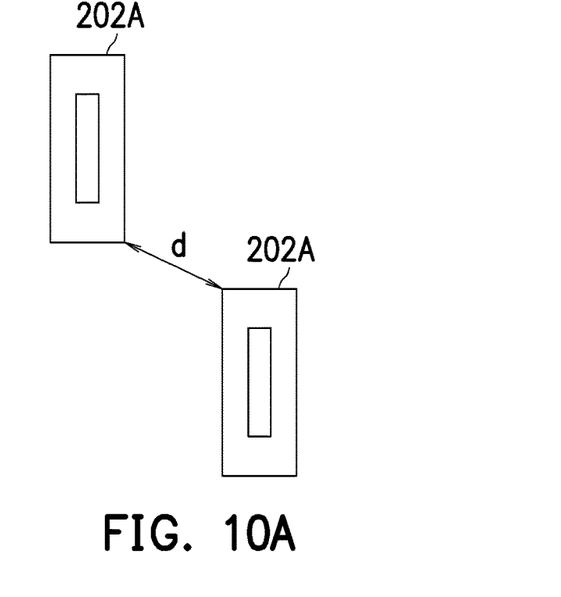
FIGS. 10A and 10B are drawings, schematically illustrating mechanism of vertex-to-vertex check, according to an embodiment of the invention.
Figure 10B:
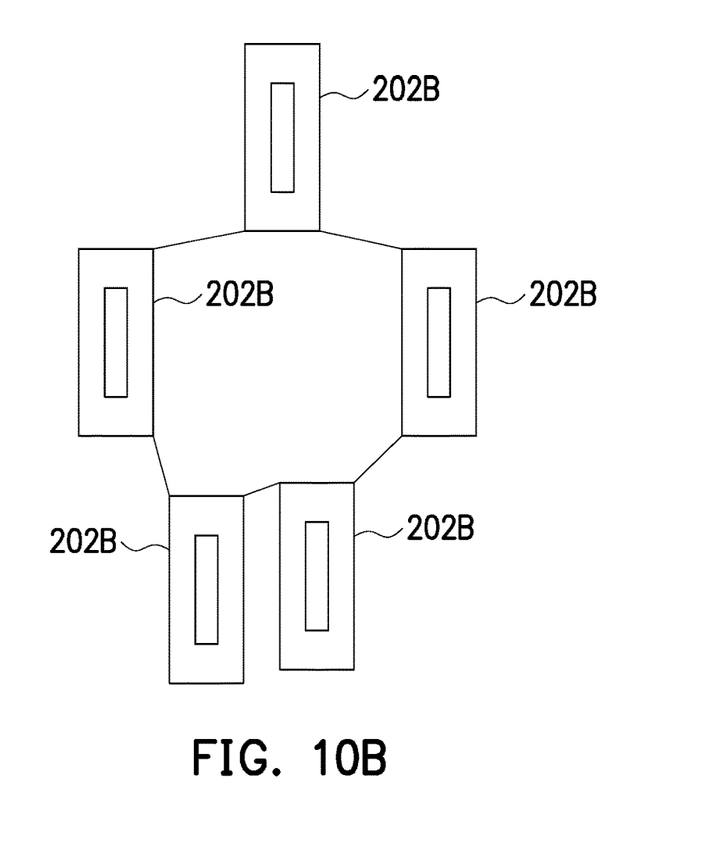

FIGS. 10A and 10B are drawings, schematically illustrating mechanism of vertex-to-vertex check, according to an embodiment of the invention. Referring to FIG. 10A, in the contact window pattern of the same phase, the contact window 202A may be an isolation type, then the distance d for vertex to vertex is also needed to be checked. Referring to FIG. 10B, taking a contact window pattern for another phase as an example, the contact windows 202B after decomposition form a surrounded group. The length of vertex-to-vertex parameter needs also to be checked.

Figure 11:
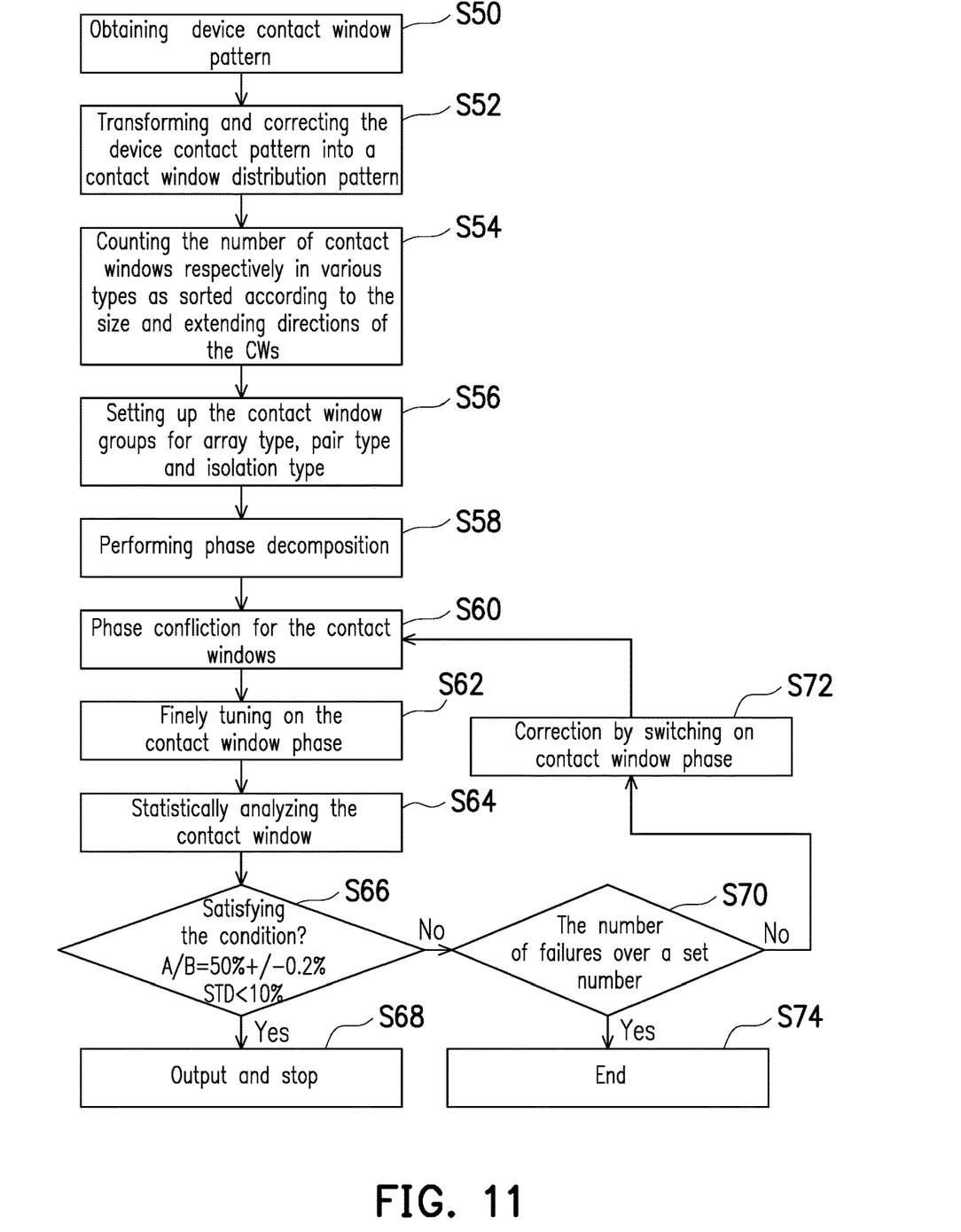
FIG. 11 is a drawing, schematically illustrating a flow of the process method for producing photomask with double patterns, according to an embodiment of the invention.
Figure 12:
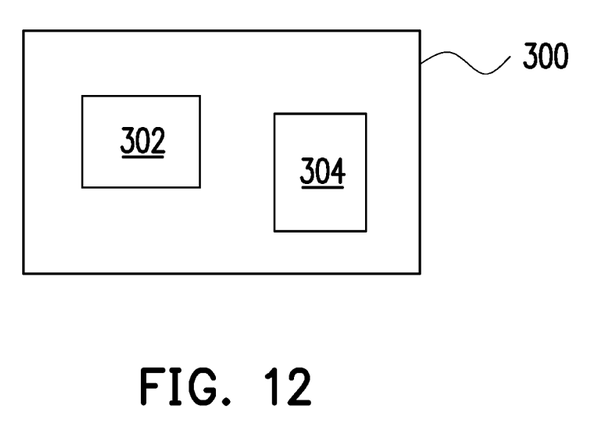
FIG. 12 is a drawing, schematically illustrating a recording medium used a process system for producing photomask with double patterns, according to an embodiment of the invention.

After setting up the checking mechanism for various types of contact windows, the invention proposes a processing method for producing photomask with double patterns. FIG. 11 is a drawing, schematically illustrating a flow of the process method for producing photomask with double patterns, according to an embodiment of the invention. FIG. 12 is a drawing, schematically illustrating a recording medium used a process system for producing photomask with double patterns, according to an embodiment of the invention.

Referring to FIG. 11 and FIG. 12, in an embodiment, the method in the invention can be a processing program in an example, which is stored in a recording medium 302 and may be read by the processing system 300, such as a computer system, and be executed by the central processing unit 304. Thus, it systematically analyzes the configuration for the contact windows actually needed in design and outputs the two contact window patterns after decomposition, good for producing the photomasks.

Referring to FIG. 11, the processing method for producing photomask with double patterns is described. In step S50, it obtains a device contact window pattern. The device contact window pattern comprises multiple contact windows as to be formed. In step S52, it transforms and corrects the contact window pattern into contact window distribution pattern. To form the contact window structures as designed, it needs to fabricate the photomask, firstly. Thus, as an example, the data for the size correction as needed in lithographic process. The contact windows as needed by the photomask is obtained after correcting the size of the contact windows for the contact windows. The contact windows form as a contact window distribution pattern.

In step S54, it counts the number of contact windows respectively in various types as sorted according to the size and extending directions of the contact windows. The size of the contact windows usually is a bar of right-angled quadrilateral and alternatively may include square shape. Thus, it may have various contact window sizes in accordance with the size variation of the contact windows. It includes the contact windows extending along the X-axis and the Y-axis. According to the various types of the contact windows after sorting, the number of the contact windows in each type is respectively counted. That is, the contact windows are sorted into various contact window groups according to various contact window sizes.

In step S56, it sets up the contact window groups for array type contact windows 102, pair type contact windows 100 and isolation type contact windows 104. That is, the contact windows contained in each of the contact window groups are identified into a number of contact window blocks, according to the characteristics of array type contact windows 102, pair type contact windows 100 and isolation type contact windows 104. Actually, the array type contact windows 102, the pair type contact windows 100 and the isolation type contact windows 104 respectively have multiple numbers, and are mixed to one another.

In step S58, it performs phase decomposition. After the contact windows are identified into the array type contact windows 102, the pair type contact windows 100 and the isolation type contact windows 104 according to the geometry size, the contact windows in the same contact window blocks are decomposed into two types of contact windows according to the distribution. As described by phase, the two types of contact windows are the contact windows of phase A and the contact windows of phase B. The phase decomposition is shown in FIG. 4 and FIG. 5, in which the contact windows are decomposed by zigzag staggering manner.

In step 60, it checks phase confliction for the contact windows. As to the checking mechanism shown in FIGS. 6A-6C, FIG. 7, FIG. 8A-8B, FIGS. 9A-9C, and FIGS. 10A-10B, the contact window distribution after decomposition is checked to see whether or not there is contact windows with phase confliction. In step S62, it performs a fine tune on the contact window phase. When the phase confliction occurs in the contact windows, the fine tune on the contact window phase is taken, such as switching the current phase of the contact window. In an actual example, to the contact window of isolation type, the required condition to take the phase A or phase B during the phase decomposition is relative weak and may more easily cause a confliction to the contact window which has already been decomposed. In this situation, the fine tune by switch the phase can effectively exclude the conflictions of the contact windows.

In step S64, it performs statistically analyzing the contact window. The contact windows are individually decomposed according to the geometric shape and the size of the contact window. By the statistic analysis, the numbers of contact windows for the phase A and phase B can be obtained. The number of contact windows may be changed due to different decomposition strategy. The numbers of the contact windows of phase A and phase B are equal in an ideal state, that is, having 50% for each. The decomposition result may also be different with respect to different size of contact window. As to the various factors above and so on, the averaged value and the standard deviation (STD) may be obtained through the statistic analysis.

In step S66, it assures whether or not the phase decomposition is satisfying the condition, which is AB=50%+/−0.2% and STD<10%. The error range is +/−0.2% is an example as indicated but not the only range.

If the condition in step 66 is satisfied, it then enters the step 68 for ending the process and output the contact windows of phase A and the contact windows of phase B after decomposition. If the condition in step 66 is not satisfied, it then enters the step 70 to check whether or not the contact window phase after correction for several times is still not satisfying the condition. If the failure times is over a set value, the process then enters the step S74 for ending the process and the state may additionally be fed back to the designer for change. If the failure times is still not over the set value, it enters the step S72 to have a larger correction to change the decomposition strategy by switching the contact window phase. After then, it enters to the step 60 again for another loop.

Referring to FIG. 12, in an embodiment, the method in the invention can be written into a software program, which is stored in a recording medium 302. In an example, the computer system 300 may read the software program from the recording medium 302 and be executed by the central processing unit 304 to perform the foregoing method.

As the foregoing descriptions, the invention has proposed a processing method for producing photomask with double patterns. The contact window pattern distribution of the original photomask may be decomposed into two sub-photomasks. The numbers of the contact windows of the two sub-photomasks are substantially equal and the distance between adjacent contact windows cam be increased.

What is claimed is:

1. A processing method for producing photomask with double patterns, used by a processing apparatus, comprising:
   obtaining a contact distribution pattern by a processing system, the contact distribution pattern as an original pattern corresponding to a photomask pattern to be formed comprising a plurality of contact windows;
   sorting the contact windows by the processing system into a plurality of contact window groups according to sizes of the contact windows;
   identifying the contact windows of each of the contact window groups by the processing system into contact blocks of an array type, a pair type, or an isolation type;
   performing a phase decomposition of the contact windows by the processing system, wherein the contact windows respectively belonging to the array type, the pair type and the isolation type are decomposed into a first pattern group and a second pattern group according to an optimized parameter, wherein an effective distance between the contact windows in the first pattern group and the second pattern group is larger than an effective distance between the contact windows in the photomask pattern;
   entering a loop processing step executed by the processing system, the loop processing step comprising:
      checking by the processing system whether or not a confliction port occurs between the first pattern group and the second pattern group, according to a phase rule check;
      if the confliction portion occurring, modifying the first pattern group and the second pattern group with a fine adjustment by switching to each other;
      performing by the processing system a statistic analysis on the first pattern group and the second pattern group, checking whether or not the first pattern group and the second pattern group are consisting to each other within an error range as allowed, wherein when the first pattern group and the second pattern group are consistent and then are output; and
      performing by the processing system a phase switching modification of the contact windows and returning back to and continuing the loop processing step when the first pattern group and the second pattern group are inconsistent,
   wherein if a number of the looping is over a threshold, then the looping processing step stops and a failure notification is issued.

2. The processing method of claim 1, wherein the step of performing the statistic analysis on the first pattern group and the second pattern group comprises:
   calculating a quantity of the contact windows respectively for the first pattern group and the second pattern group after the phase decomposition of the contact windows;
   performing a statistic calculation for each of the sizes of the contact windows, according a standard deviation in the statistic analysis, so to obtain a quantity ratio between the first pattern group and the second pattern group; and
   determining a whole decomposing rate after the first pattern group and the second pattern group are decomposed, wherein the decomposing rate is 50% to 50% within an allowable range, and the standard deviation is the less than a present value, the first pattern group and the second pattern group are output.

3. The processing method of claim 1,
   wherein the array type has at least three contact windows as same and adjacent within a set distance, regularly distributing in one-dimension or two-dimension,
   wherein the pair type has two contact windows as same and adjacent within a set distance, distributed with boundaries of the two contact windows being parallel and having an overlap, and
   wherein the isolation type is the contact windows other thane the array type and the pair type.

4. The processing method of claim 1, wherein each of the contact window blocks of the pair type is decomposed by interposing.

5. The processing method of claim 1, wherein each of the contact window blocks of the array type is decomposed by zigzag staggering.

6. The processing method of claim 1, wherein each of the contact window blocks of the isolation type is an individual contact window alternately assigned to the first pattern group and the second pattern group.

7. A processing method for producing photomask with double patterns, comprising:
   obtaining a contact distribution pattern by a processing system, the contact distribution pattern as an original pattern corresponding to a photomask pattern to be formed comprising a plurality of contact windows, sizes of the contact windows comprise corrections with a lithographic factor;
   sorting the contact windows by the processing system into a plurality of contact window groups according to sizes and extending directions of the contact windows;
   identifying the contact windows of each of the contact window groups by the processing system into contact blocks of an array type, a pair type, or an isolation type;
   decomposing the contact windows by the processing system into a first pattern group and a second pattern group, wherein an effective distance between the contact windows in the first pattern group and the second pattern group is larger than an effective distance between the contact windows in the photomask pattern, wherein the first pattern group and a second pattern group are configured to interpose to each other, wherein a first quantity of the contact windows in the first pattern group is consisting with a second quantity of the contact windows in the second pattern group within an error range; and respectively checking the first pattern group and the second pattern group by the processing system to determine whether or not a gap between adjacent two of the contact windows is less than a minimum distance;

changing by the processing system, an assignment of the first pattern group and the second pattern group for one of the adjacent two of the contact windows having the gap less than the minimum distance when a condition to decompose the contact windows still remains being satisfied; and outputting by the processing system, the first pattern group and the second pattern group to correspondingly produce a first photomask and a second photomask.

8. The processing method of claim 7, wherein each of the contact window blocks of the pair type is decomposed by interposing.

9. The processing method of claim 7, wherein each of the contact window blocks of the array type is decomposed by zigzag staggering.

10. A recording medium, executed by the processing system, the recording medium comprises a processing program to execute the processing method of claim 1.

\* \* \* \* \*